United States Patent
Lee et al.

(10) Patent No.: US 7,675,777 B2
(45) Date of Patent: Mar. 9, 2010

(54) NON-VOLATILE SEMICONDUCTOR MEMORY DEVICE USING ADJACENT BIT LINES FOR DATA TRANSMISSION AND METHOD OF DRIVING THE SAME

(75) Inventors: You Sang Lee, Seongnam-si (KR); Sang Won Hwang, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 287 days.

(21) Appl. No.: 11/528,924

(22) Filed: Sep. 28, 2006

(65) Prior Publication Data

US 2007/0171715 A1 Jul. 26, 2007

(30) Foreign Application Priority Data

Jan. 3, 2006 (KR) .................... 10-2006-0000432

(51) Int. Cl.
*G11C 16/04* (2006.01)
(52) U.S. Cl. ............................ 365/185.12; 365/185.11
(58) Field of Classification Search ............ 365/185.11, 365/185.12, 185.17
See application file for complete search history.

(56) References Cited

U.S. PATENT DOCUMENTS

| 5,424,997 | A | 6/1995 | Rapp | |
|---|---|---|---|---|
| 6,671,204 | B2 * | 12/2003 | Im | 365/185.12 |
| 6,798,697 | B2 * | 9/2004 | Hosono et al. | 365/185.12 |
| 6,845,042 | B2 | 1/2005 | Ichige et al. | |
| 2007/0115724 | A1 * | 5/2007 | Hwang | 365/185.17 |

FOREIGN PATENT DOCUMENTS

| KR | 1020000015348 A | 3/2000 |
|---|---|---|
| KR | 1020010092073 A | 1/2001 |
| KR | 1020010026586 A | 4/2001 |
| KR | 1020010092073 | 10/2001 |
| KR | 1020020046320 | 6/2002 |
| KR | 1020060102919 | 9/2006 |

* cited by examiner

*Primary Examiner*—Hoai V Ho
*Assistant Examiner*—Kretelia Graham
(74) *Attorney, Agent, or Firm*—F. Chau & Associates, LLC

(57) ABSTRACT

A non-volatile semiconductor memory device, including a memory array having a plurality of first bit line groups and a plurality of second bit line groups that are alternately arranged to be adjacent each other, a plurality of data lines, a plurality of first page buffers, a plurality of second page buffers, and a plurality of switches. Each of the first page buffers is electrically connected to a corresponding one of the first bit line groups and arranged on a first side of the memory array. The first page buffers transmit data to the data lines. Each of the second page buffers is electrically connected to a corresponding one of the second bit line groups and arranged on a second side of the memory array. Each of the switches enables data transmission between a corresponding one of the first page buffers and a corresponding one of the second page buffers.

10 Claims, 14 Drawing Sheets

NON-VOLATILE SEMICONDUCTOR MEMORY DEVICE USING ADJACENT BIT LINES FOR DATA TRANSMISSION AND METHOD OF DRIVING THE SAME

CROSS-REFERENCE TO RELATED PATENT APPLICATION

This application claims priority to Korean Patent Application No. 2006-432, filed on Jan. 3, 2006, in the Korean Intellectual Property Office, the disclosure of which is incorporated by reference herein.

BACKGROUND OF THE INVENTION

1. Technical Field

The present disclosure relates, in general, to non-volatile semiconductor memory devices and, more particularly, to a non-volatile semiconductor memory device to minimize skew and reduce chip layout area, and a method of driving the same.

2. Discussion of the Related Art

Generally, a non-volatile semiconductor memory device includes a memory array having a plurality of memory cells, page buffers, and data lines. The memory cells receive or transmit data through their respective bit lines. The page buffers latch data corresponding to voltage levels of the bit lines. The page buffers also transmit or receive data to or from the data lines. The data lines typically transmit or receive data to or from data pads arranged on one side of the non-volatile semiconductor memory device.

FIG. 1 illustrates a conventional non-volatile semiconductor memory device. In FIG. 1, a memory array 10 includes a plurality of bit line groups BL<1> to BL<8>. Each of the bit line groups BL<1> to BL<8> may be implemented using a single bit line or two bit lines forming a pair. Although not shown in the drawing, each of the bit line groups BL<1> to BL<8> is connected to a plurality of memory cells. The bit line groups BL<1> to BL<8> are connected to corresponding page buffers PB<1> to PB<8>, respectively. The page buffers PB<1> to PB<8> are connected to a data input/output (I/O) unit 50 through corresponding data lines DL<1> to DL<8>.

For convenience of layout, respective page buffers PB<1> to PB<8> are alternately arranged above and below the memory array 10. However, the data I/O unit 50 is arranged on one side of the memory array 10 (in FIG. 1, below the memory array).

In the conventional non-volatile semiconductor memory device of FIG. 1, the data lines DL<1>, DL<3>, DL<5> and DL<7>, connected to the page buffers PB<1>, PB<3>, PB<5> and PB<7>, which are arranged below the memory array 10, have a relatively short bus length. However, the data lines DL<2>, DL<4>, DL<6> and DL<8>, connected to the page buffers PB<2>, PB<4>, PB<6> and PB<8>, which are arranged above the memory array 10, have a relatively long bus length.

Therefore, during the transmission of data, skew occurs between the lower page buffers PB<1>, PB<3>, PB<5> and PB<7> and the upper page buffers PB<2>, PB<4>, PB<6> and PB<8>. Further, a large layout area is required for wiring between the upper page buffers PB<2>, PB<4>, PB<6> and PB<8> and the data I/O unit 50.

There is a need for a non-volatile semiconductor memory device that can minimize skew and reduce chip layout area.

SUMMARY OF THE INVENTION

According to an exemplary embodiment of the present invention, there is provided a non-volatile semiconductor memory device having a memory array including a plurality of first bit line groups and a plurality of second bit line groups that are alternately arranged to be adjacent each other, a plurality of data lines, a plurality of first page buffers, a plurality of second page buffers, and a plurality of switches. Each of the first page buffers is electrically connected to a corresponding one of the first bit line groups and arranged on a first side of the memory array. The first page buffers transmit data to the data lines. Each of the second page buffers is electrically connected to a corresponding one of the second bit line groups and arranged on a second side of the memory array. Each of the switches enables data transmission between a corresponding one of the first page buffers and a corresponding one of the second page buffers.

According to an exemplary embodiment of the present invention, there is provided a method of driving a non-volatile semiconductor memory device, which includes a memory array having a first bit line group and a second bit line group that are arranged to be adjacent each other. The method includes the steps of latching data of a memory cell connected to the second bit line group into a second page buffer, dumping the data latched into the second page buffer into a first page buffer connected to the first bit line group, and reading the data that was dumped into the first page buffer.

According to an exemplary embodiment of the present invention, there is provided a method of driving a non-volatile semiconductor memory device, which includes a memory array having a first bit line group and a second bit line group that are arranged to be adjacent each other. The method includes the steps of loading data to be programmed into a memory cell connected to the second bit line group into a first page buffer connected to the first bit line group, dumping the data loaded into the first page buffer into a second page buffer corresponding to the second bit line group, and programming the memory cell depending on the data dumped into the second page buffer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF EXEMPLARY EMBODIMENTS

Figure 1:
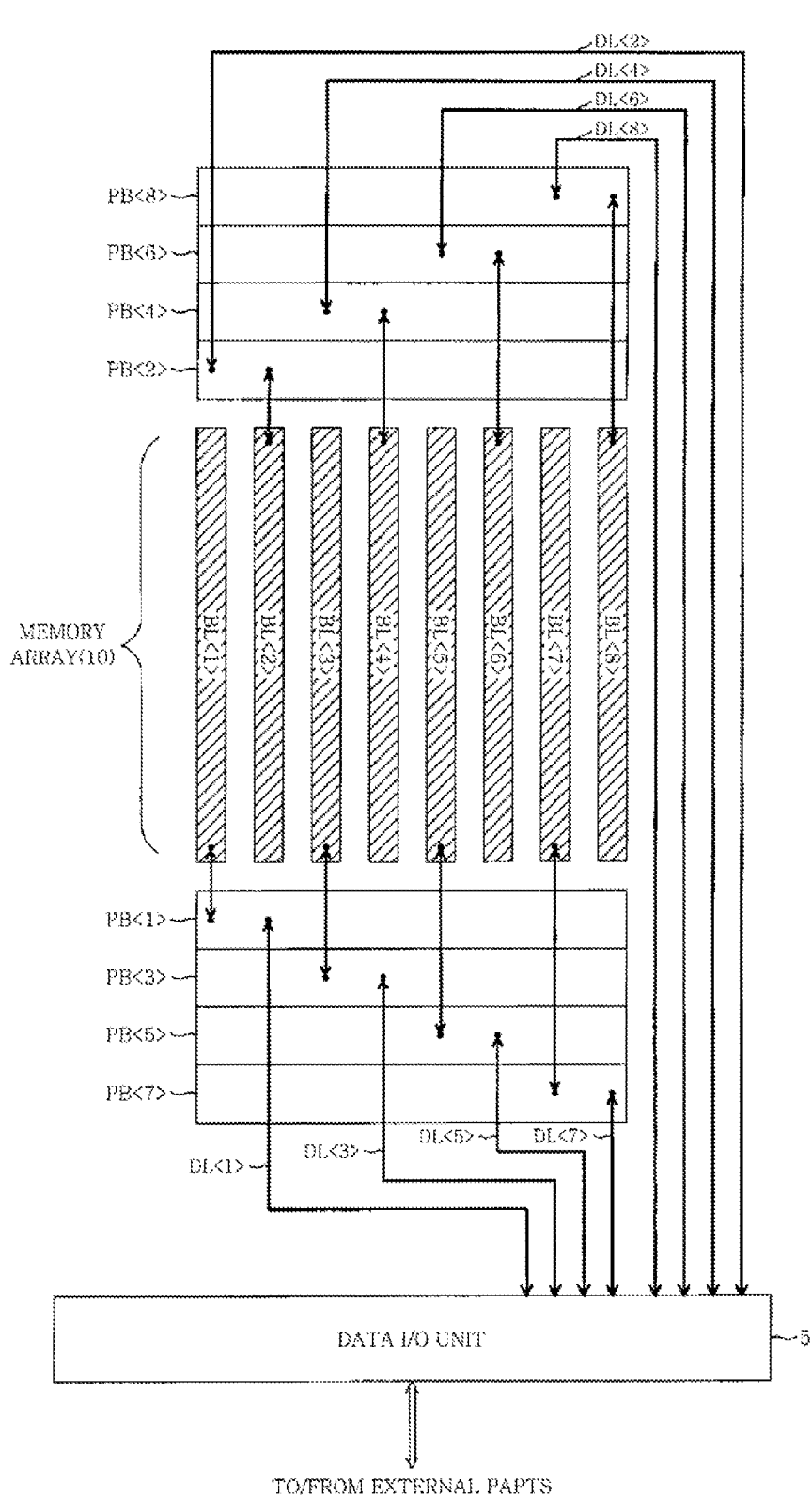
FIG. 1 illustrates a conventional non-volatile semiconductor memory device.

The same reference numerals are used throughout the different drawings to designate the same or similar components. Hereinafter, exemplary embodiments of the present invention will be described in detail with reference to the attached drawings.

Figure 2:
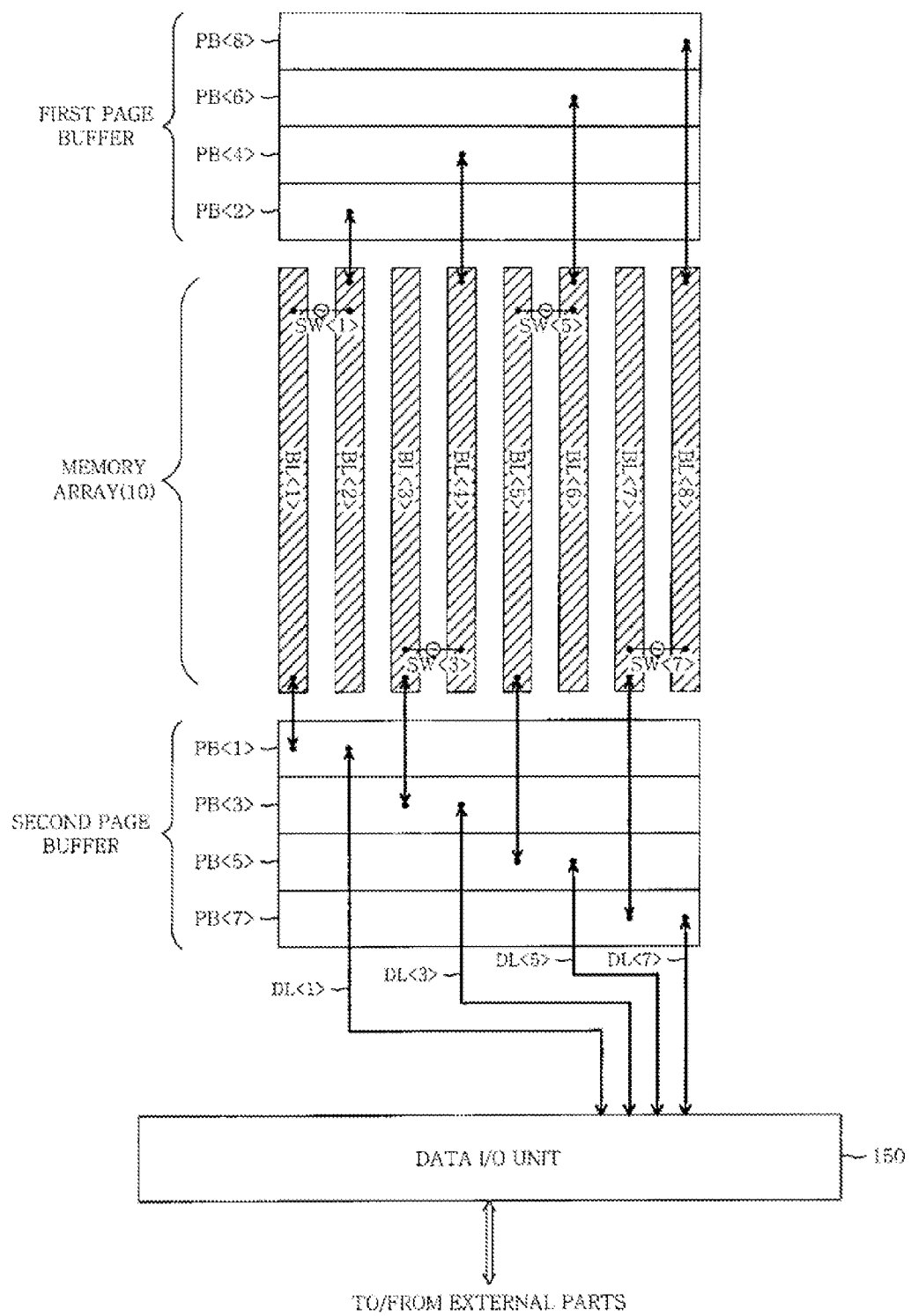
FIG. 2 illustrates a non-volatile semiconductor memory device according to an exemplary embodiment of the present invention.

FIG. 2 illustrates a non-volatile semiconductor memory device according to an exemplary embodiment of the present invention. Referring to FIG. 2, the non-volatile semiconductor memory device includes a memory array 10, a plurality of data lines DL<1>, DL<3>, DL<5> and DL<7>, a plurality of first page buffers PB<1>, PB<3>, PB<5> and PB<7>, a plurality of second page buffers PB<2>, PB<4>, PB<6> and PB<8>, and a plurality of switches SW<1>, SW<3>, SW<5> and SW<7>.

The memory array 10 includes first bit line groups BL<1>, BL<3>, BL<5> and BL<7> and second bit line groups BL<2>, BL<4>, BL<6> and BL<8>. The first bit line groups BL<1>, BL<3>, BL<5> and BL<7> and the second bit line groups BL<2>, BL<4>, BL<6> and BL<8> are ultimately arranged in parallel to be adjacent to each other. Each of the first bit line groups BL<1>, BL<3>, BL<5> and BL<7> and the second bit line groups BL<2>, BL<4>, BL<6> and BL<8> is connected to a plurality of memory cells, but the memory cells are not shown, for simplicity of the drawing.

The first page buffers PB<1>, PB<3>, PB<5> and PB<7> are connected to the corresponding first bit line groups BL<1>, BL<3>, BL<5> and BL<7>, respectively. The first page buffers PB<1>, PB<3>, PB<5> and PB<7> are arranged below the memory array 10. The first page buffers PB<1>, PB<3>, PB<5> and PB<7> are connected to the corresponding data lines DL<1>, DL<3>, DL<5> and DL<7>, respectively, to transmit data to the data lines.

The second page buffers PB<2>, PB<4>, PB<6> and PB<8> are connected to the corresponding second bit line groups BL<2>, BL<4>, BL<6> and BL<8>, respectively. The second page buffers PB<2>, PB<4>, PB<6> and PB<8> are arranged above the memory array 10.

The first page buffers PB<1>, PB<3>, PB<5> and PB<7> and the second page buffers PB<2>, PB<4>, PB<6> and PB<8> are arranged in a stacked structure. This structure is implemented for convenience of layout. Further, a data input/output (I/O) unit 150 is arranged below the memory array 10.

A region arranged below the memory array 10 can be designated as a 'first side', and a region arranged above the memory array 10 can be designated as a 'second side'. The 'first side' and the 'second side' may be symmetrical around the memory array 10.

Each of the switches SW<1>, SW<3>, SW<5> and SW<7> is controlled so that data between the first page buffer PB<1>, PB<3>, PB<5> or PB<7> and the second page buffer PB<2>, PB<4>, PB<6> or PB<8>, which correspond to each other, are electrically connected to each other.

In an exemplary embodiment of the present invention, each of the switches SW<1>, SW<3>, SW<5> and SW<7> controls the electrical connection between the first bit line group BL<1>, BL<3>, BL<5> or BL<7> and the second bit line group BL<2>, BL<4>, BL<6> or BL<8>, which correspond to each other. The second page buffers PB<2>, PB<4>, PB<6> and PB<8> transmit data to the corresponding data lines DL<1>, DL<3>, DL<5> and DL<7> through the corresponding switches SW<1>, SW<3>, SW<5> and SW<7> and the corresponding first page buffers PB<1>, PB<3>, PB<5> and PB<7>.

The switches SW<1>, SW<3>, SW<5> and SW<7> may be alternately arranged on the upper and lower portions of the memory array 10, as shown in FIG. 2.

Figure 3:
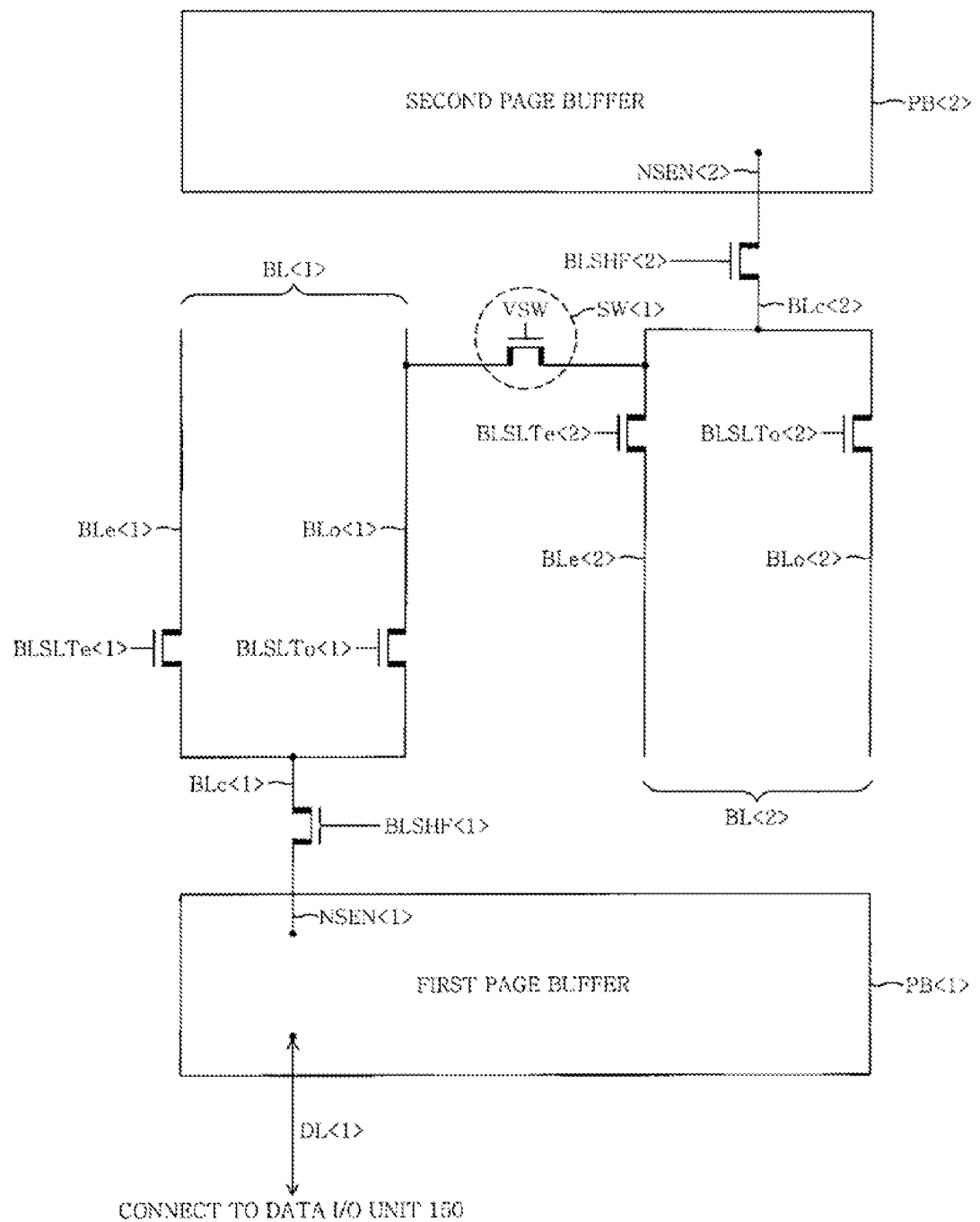
FIG. 3 illustrates an exemplary embodiment of the first and second bit line groups BL<1> and BL<2> of FIG. 2.

FIG. 3 illustrates an exemplary embodiment of the first and second bit line groups BL<1> and BL<2> of FIG. 2.

Referring to FIG. 3, the first bit line group BL<1> includes an even bit line BLe<1>, an odd bit line BLo<1> and a common bit line BLc<1>. The even bit line BLe<1> and the odd bit line BLo<1> are selectively connected to the common bit line BLc<1> in response to an even bit line selection signal BLSLTe<1> and an odd bit line selection signal BLSLTo<1>, respectively. The common bit line BLc<1> is electrically connected to the sensing node NSEN<1> of the first page buffer PB<1> in response to a bit line shielding signal BLSHF<1>.

Further, the second bit line group BL<2> includes an even bit line BLe<2>, an odd bit line BLo<2> and a common bit line BLc<2>. The even bit line BLe<2> and the odd bit line BLo<2> are selectively connected to the common bit line BLc<2> in response to an even bit line selection signal BLSLTe<2> and an odd bit line selection signal BLSLTo<2>, respectively. Further, the common bit line BLc<2> is electrically connected to the sensing node NSEN<2> of the second page buffer PB<2> in response to a bit line shielding signal BLSHF<2>.

Further, the odd bit line BLo<1> of the first bit line group BL<1> is arranged to be adjacent the even bit line BLe<2> of the second bit line group BL<2>.

Although a bit line arranged on a left side in a single bit line group is defined above as an 'even bit line', and a bit line arranged on a right side is defined above as an 'odd bit line', the present invention is not limited to this definition. A bit line arranged on a left side may be defined as an 'odd bit line', and a bit line arranged on a right side may be defined as an 'even bit line'.

Further, the switch SW<1> electrically connects the first bit line group BL<1> to the second bit line group BL<2> in response to a switching signal VSW. The switch SW<1> electrically connects the odd bit line BLo<1> of the first bit line group BL<1> to the common bit line BLc<2> of the second bit line group BL<2>.

Each of the even bit lines BLe<1> and BLe<2> and the odd bit lines BLo<1> and BLo<2> of the first and second bit line groups BL<1> and BL<2> is connected to a plurality of memory cells. However, in the present specification, such connection is not shown, for simplicity of the drawing.

Figure 4:
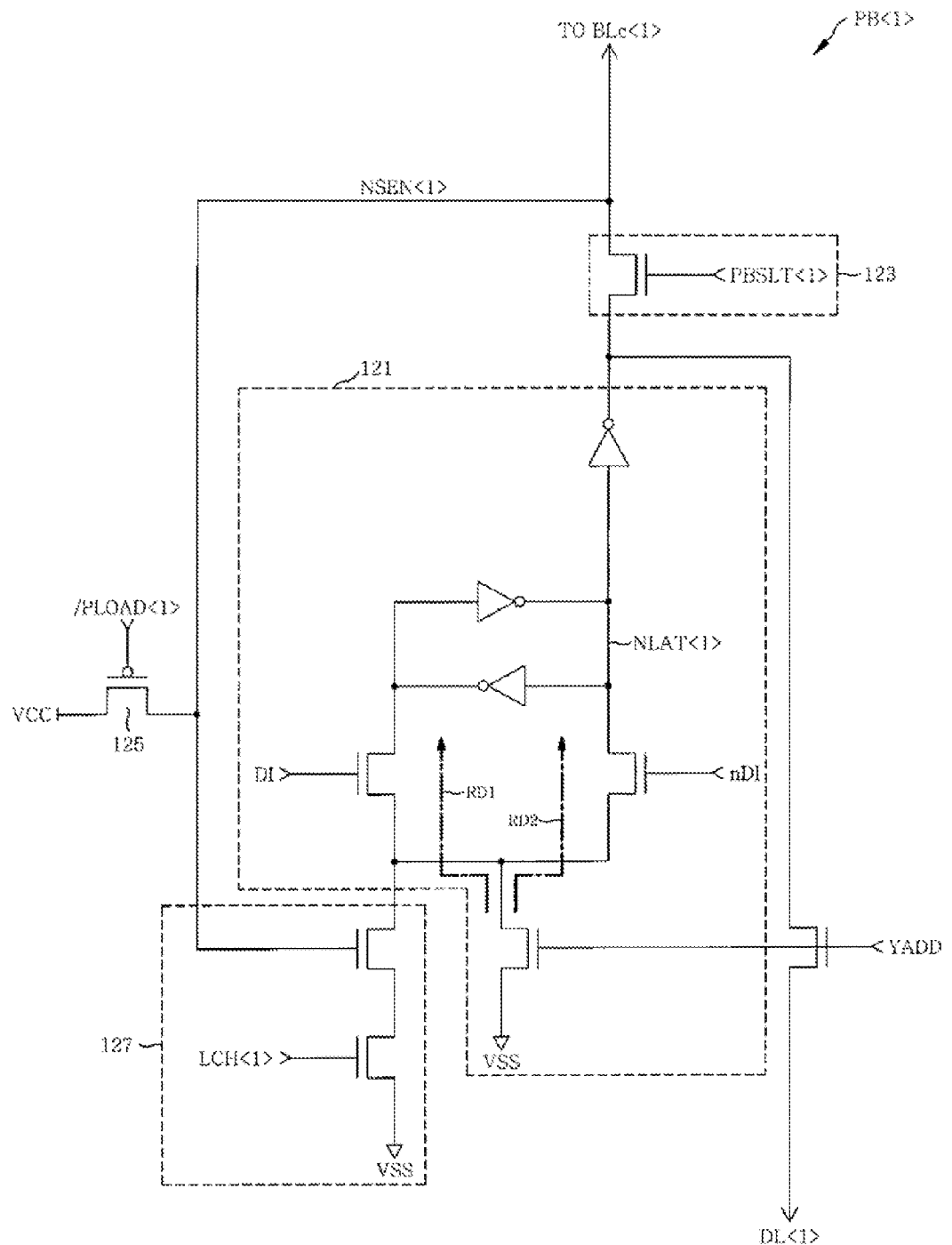
FIG. 4 illustrates an exemplary embodiment of the first page buffer of FIG. 3.

FIG. 4 illustrates an exemplary embodiment of the first page buffer PB<1> of FIG. 3. Referring to FIG. 4, the first page buffer PB<1> includes a loading latch unit 121, a sensing unit 127, and a buffer selection unit 123.

During a data programming operation, the loading latch unit 121 is enabled in response to a Y-address YADD, and the loading latch unit 121 latches and stores data, corresponding to a data input signal DI and an inverted data input signal nDI, on a latch terminal NLAT<1>. When a memory cell (not shown) is intended to be programmed to '0', data having a logic high (H) state is loaded and stored on the latch terminal NLAT<1> through a first data loading path RD1. Further, when the memory cell is set to a programming prohibition mode, data having a logic low (L) state is loaded and stored on the latch terminal NLAT<1> through a second data loading path RD2.

The sensing node NSEN<1> is a terminal that can be electrically connected to the common bit line BLc<1>, and guides the output of the loading latch unit 121 to the common bit line BLc<1>.

Therefore, when a selected memory cell is intended to be programmed to '0 ', the voltage levels of the sensing node NSEN<1> and the common bit line BLc<1> are adjusted to a ground voltage VSS. Further, when a selected memory cell is set to a programming prohibition mode, the voltage levels of the sensing node NSEN<1> and the common bit line BLc<1> are adjusted to a supply voltage VCC.

The buffer selection unit 123 provides data output from the loading latch unit 121 to the common bit line BLc<1> through the sensing node NSEN<1>, in response to a buffer selection signal PBSLT<1>.

The sensing unit 127 is enabled in response to a latch control signal LCH<1>. Further, the sensing unit 127 toggles data of the latch terminal NLAT<1> in response to data of the sensing node NSEN<1> during a data read operation. The data of the latch terminal NLAT<1> is provided to the data line DL<1>. In FIG. 4, a PMOS transistor 125 precharges the sensing node NSEN<1> to the supply voltage VCC in response to a sensing precharge signal /PLOAD<1>.

Figure 5:
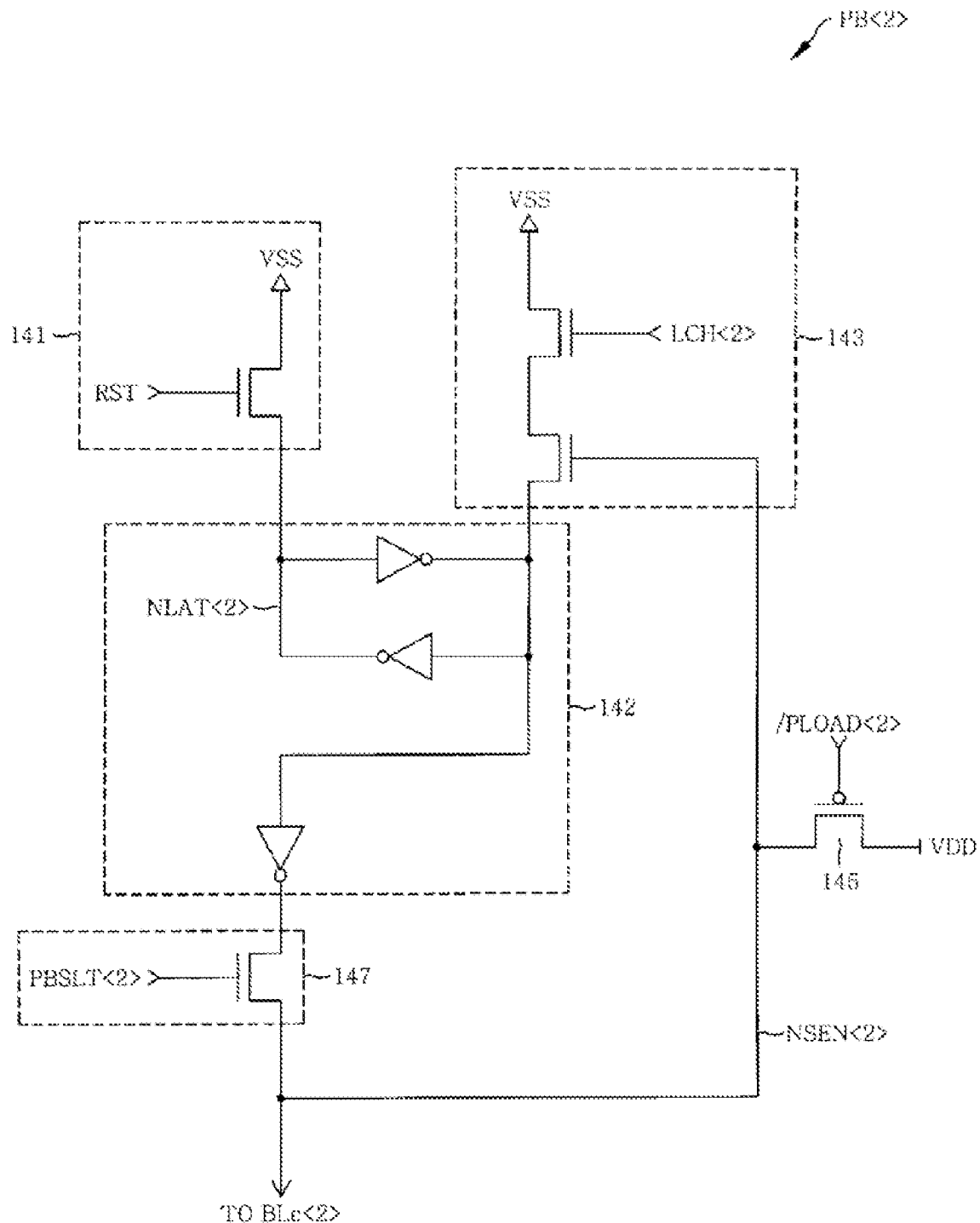
FIG. 5 illustrates an exemplary embodiment of the second page buffer of FIG. 3.

FIG. 5 illustrates an exemplary embodiment of the second page buffer PB<2> of FIG. 3. Referring to FIG. 5, the second page buffer PB<2> includes a reset unit 141, a loading latch unit 142, a sensing unit 143 and a buffer selection unit 147.

The reset unit 141 resets a latch terminal NLAT<2> to a logic L state in response to a reset signal RST. The loading latch unit 142 latches and stores data corresponding to the voltage level of a sensing node NSEN<2> on the latch terminal NLAT<2>.

The sensing unit 143 is enabled in response to the latch control signal LCH<2>. Further, the sensing unit 143 toggles data of the latch terminal NLAT<2> in response to data of the sensing node NSEN<2>.

In FIG. 5, a PMOS transistor 145 precharges the sensing node NSEN<2> to the supply voltage VCC in response to a sensing precharge signal /PLOAD<2>.

The sensing node NSEN<2> is a terminal that can be electrically connected to the common bit line BLc<2>, and guides the output of the loading latch unit 142 to the common bit line BLc<2>.

The buffer selection unit 147 provides data, output from the loading latch unit 142, to the sensing node NSEN<2> in response to a buffer selection signal PBSLT<2>.

The second page buffer PB<2> of FIG. 5 latches and stores data corresponding to the voltage level of the sensing node NSEN<2>, and then provides the latched data to the sensing node NSEN<2>. The voltage levels of the sensing node NSEN<2> and the common bit line BLc<2> are equal to the voltage levels thereof before being latched.

When the voltage level of the sensing node NSEN<2> is dose to the ground voltage VSS, data of the latch terminal NLAT<2> is maintained in a logic L state. Further, if the buffer selection signal PBSLT<2> is set to a logic H state, the voltage level of the sensing node NSEN<2> is adjusted to the ground voltage VSS by the data of the latch terminal NLAT<2>.

Further, when the voltage level of the sensing node NSEN<2> is dose to the supply voltage VCC, the latch terminal NLAT<2> latches and stores data having a logic H state. Further, if the buffer selection signal PBSLT<2> is activated to a logic H state, the voltage level of the sensing node NSEN<2> is adjusted to the supply voltage VCC by the data of the latch terminal NLAT<2>.

In summary, the first page buffer PB<1> is directly connected to the data line DL<1> in response to the Y-address YADD, thus transmitting data to the data line DL<1>. In contrast, the second page buffer PB<2> is not directly connected to the data line DL<1>, but may transmit or receive data to or from the first page buffer PB<1> through the switch SW<1/>. That is, the second page buffer PB<2> can read or program data using the first page buffer PB<1>.

Figure 6:
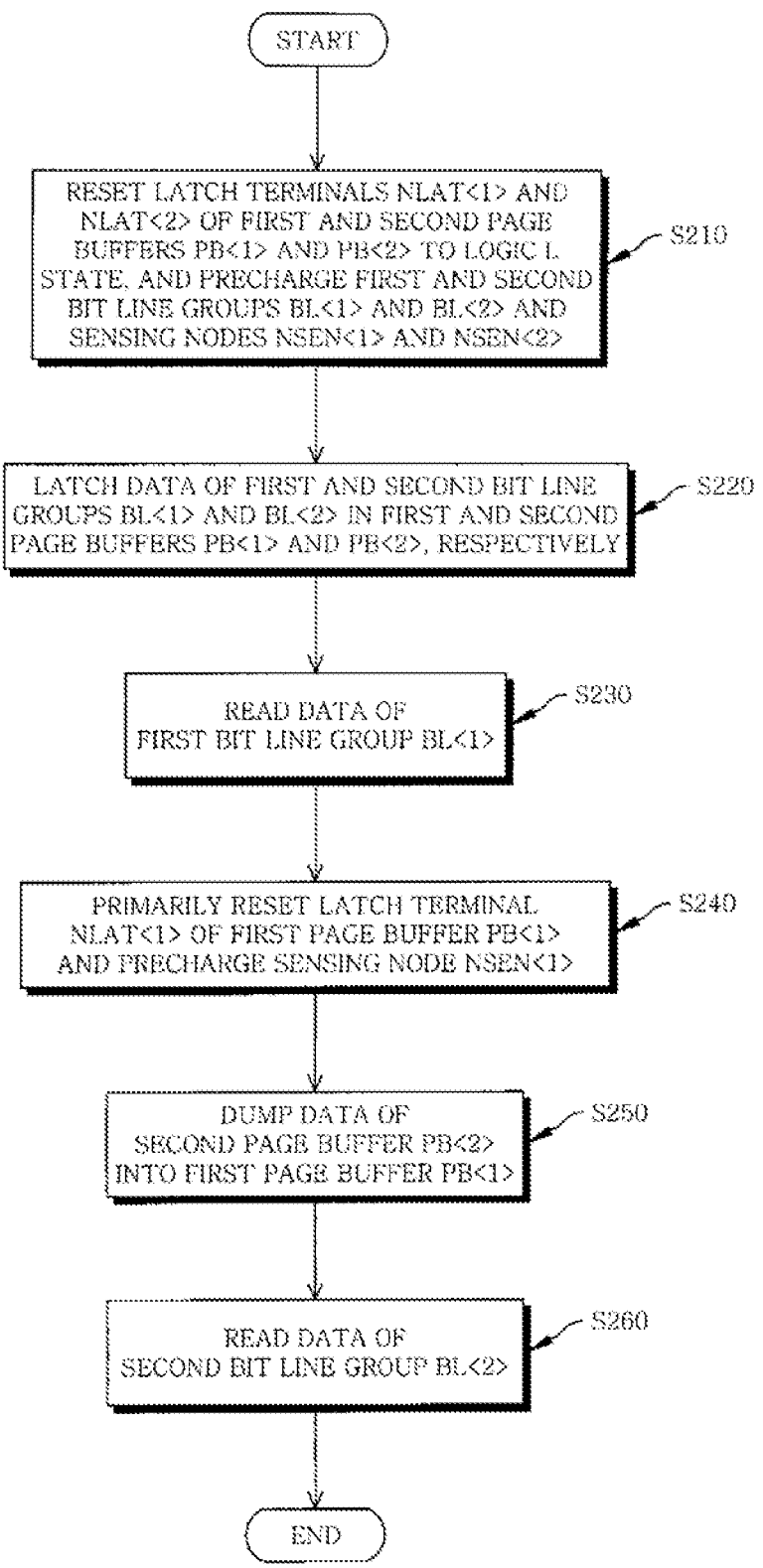
FIG. 6 is a flowchart of a data reading method for a non-volatile semiconductor memory device according to an exemplary embodiment of the present invention.
Figure 7:
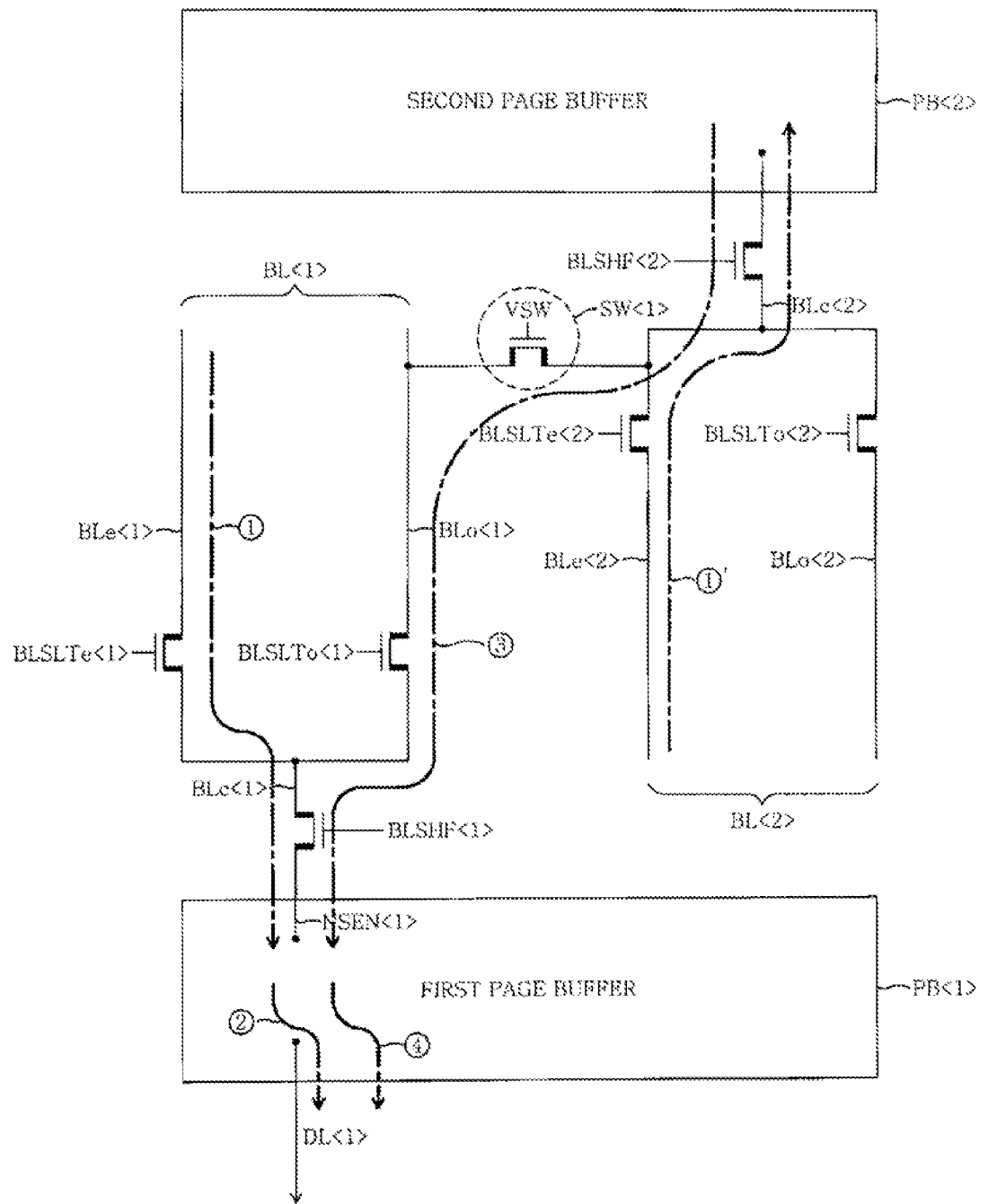
FIG. 7 illustrates data flow based on the data reading method of FIG. 6.

FIG. 6 is a flowchart of a data reading method for a non-volatile semiconductor memory device according to an exemplary embodiment of the present invention, and FIG. 7 illustrates data flow based on the data reading method of FIG. 6.

First, at a step S210, the latch terminals NLAT<1> and NLAT<2> of the first and second page buffers PB<1> and PB<2> are primarily reset to a logic L state. Further, the first and second bit line groups BL<1> and BL<2> and the sensing nodes NSEN<1> and NSEN<2> are precharged to a predetermined voltage.

At a step S220, data of the memory cells connected to the first and second bit line groups BL<1> and BL<2> is latched and stored in the latch terminals NLAT<1> and NLAT<2> of the first and second page buffers PB<1> and PB<2>(refer to [1] and [1'] of FIG. 7).

At a step S230, a read of data of the first bit line group BL<1>, stored in the first page buffer PB<1>, is performed (refer to [2] of FIG. 7).

At a step S240, the latch terminal NLAT<1> of the first page buffer PB<1> is secondarily reset to a logic L state. Further, the sensing node NSEN<1> is secondarily precharged.

At a step S250, data of the second bit line group BL<2>, latched in the second page buffer PB<2>, is dumped into the first page buffer PB<1>(refer to [3] of FIG. 7). The transmitted data passes through the odd bit line BLo<1> of the first bit line group BL<1> and the switch SW<1>.

At a step S260, a read of data of the second bit line group BL<2>, dumped into the first page buffer PB<1>, is performed (refer to [4] of FIG. 7).

In summary, the data of the second bit line group BL<2> can be read using the first page buffer PB<1>.

Figure 8:
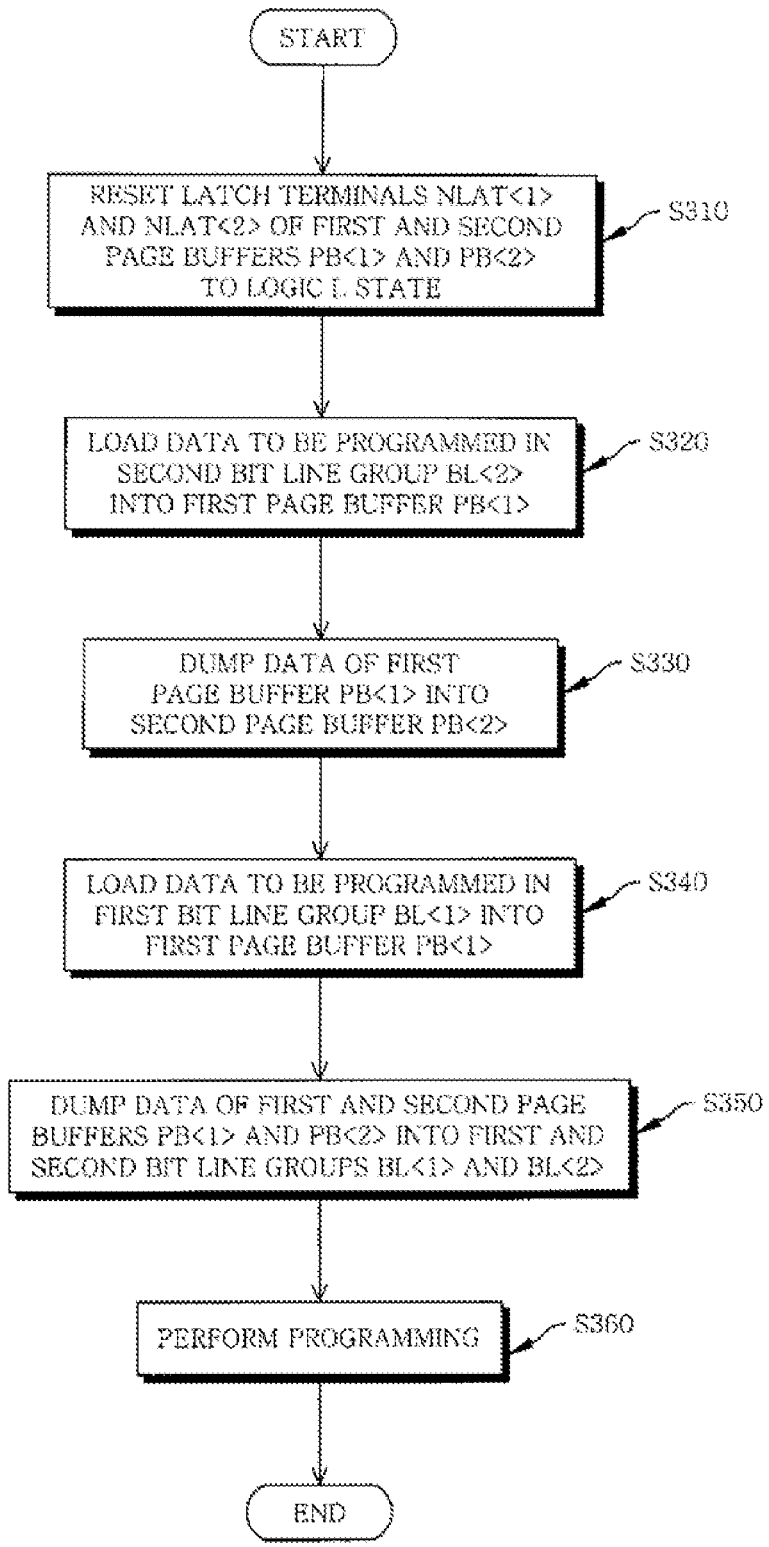
FIG. 8 is a flowchart of a data programming method for a non-volatile semiconductor memory device according to an exemplary embodiment of the present invention.
Figure 9:
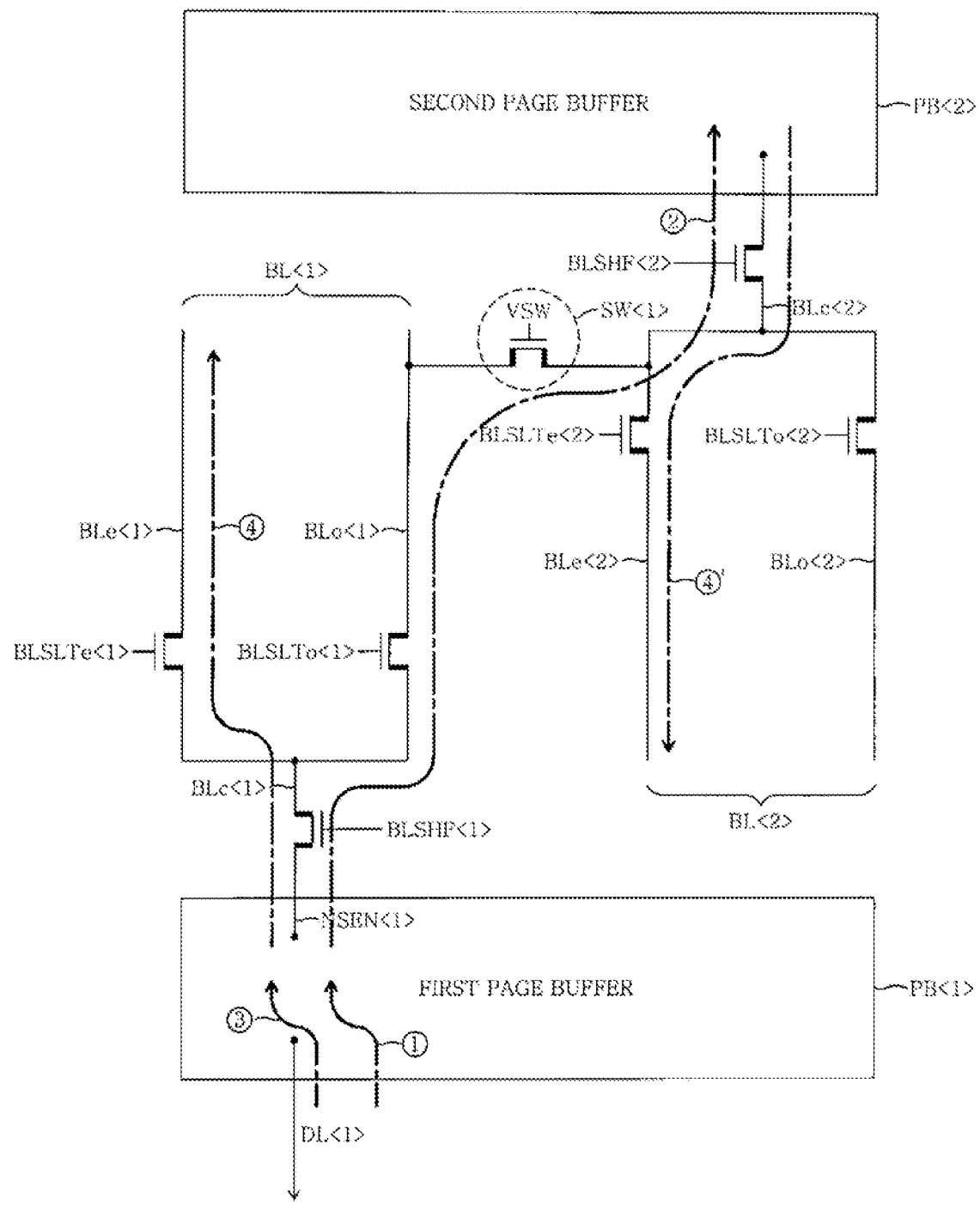
FIG. 9 illustrates data flow based on the data programming method of FIG. 8.

FIG. 8 is a flowchart of a data programming method for a non-volatile semiconductor memory device according to an exemplary embodiment of the present invention, and FIG. 9 illustrates data flow based on the data programming method of FIG. 8.

First, at a step S310, the latch terminals NLAT<1> and NLAT<2> of the first and second page buffers PB<1> and PB<2> are reset to a logic L state.

At a step S320, data to be programmed in memory cells connected to the second bit line group BL<2> is loaded on the latch terminal NLAT<1> of the first page buffer PB<1> (refer to [1] of FIG. 9).

At a step S330, data loaded into the first page buffer PB<1> is dumped into and latched in the second page buffer PB<2> (refer to [2] of FIG. 9). The transmitted data passes through the odd bit line BLo<1> of the first bit line group BL<1> and the switch SW<1>.

At a step S340, data to be programmed in the memory cells connected to the first bit line group BL<1> is loaded and latched on the latch terminal NLAT<1> of the first page buffer PB<1> (refer to ³ of FIG. 9).

At a step S350, data latched in the first and second page buffers PB<1> and PB<2> is dumped into the first and second bit line groups BL<1> and BL<2>, respectively (refer to ⁴ and ⁴¹ of FIG. 9).

Thereafter, at a step S360, a programming operation is performed using the data dumped into the first and second bit line groups BL<1> and BL<2>.

In summary, data can be programmed in the second bit line group BL<2> using the first page buffer PB<1>.

Figure 10:
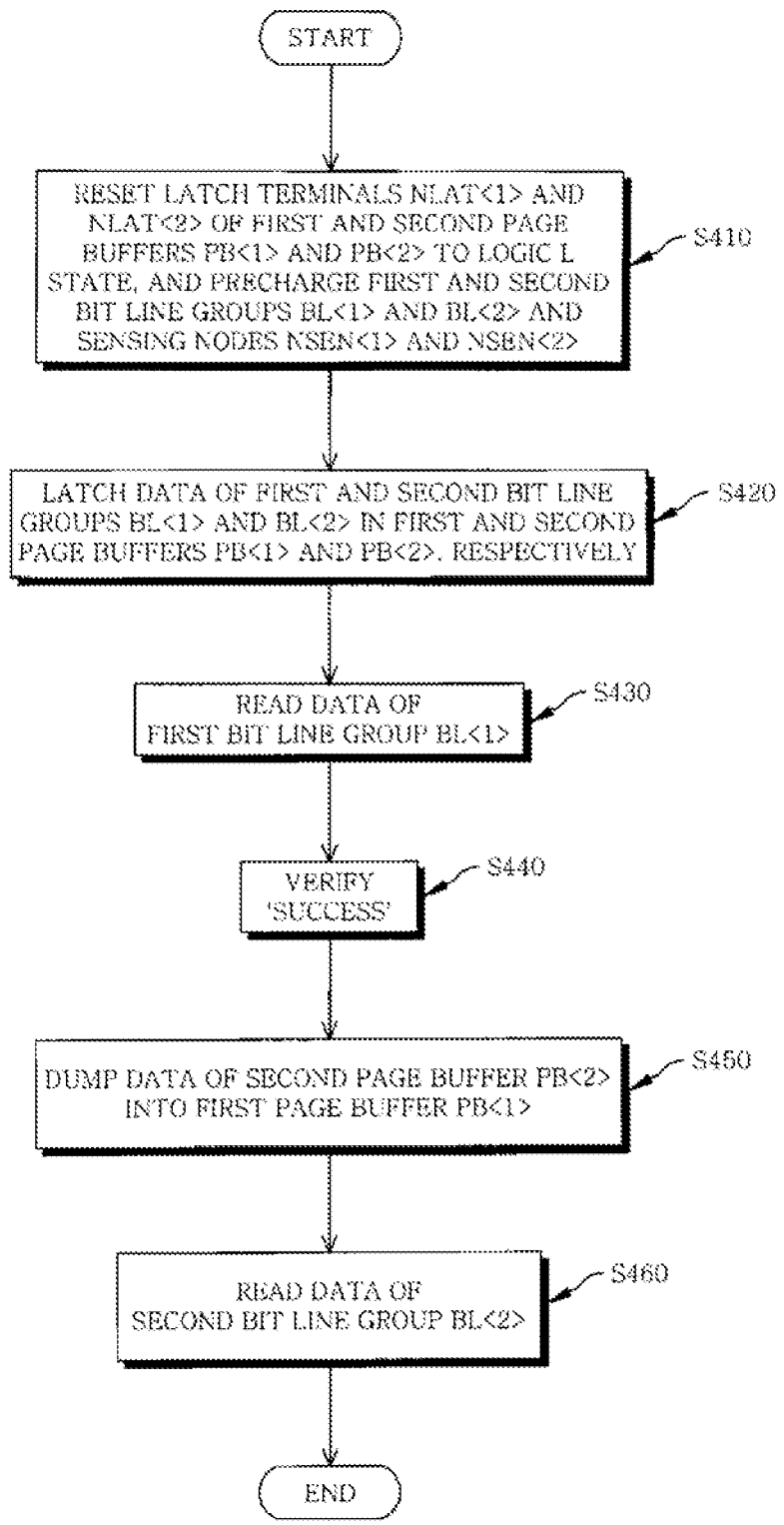
FIG. 10 is a flowchart of a verifying/reading method for a non-volatile semiconductor memory device according to an exemplary embodiment of the present invention.

FIG. 10 is a flowchart of a verifying/reading method for the non-volatile semiconductor memory device according to an exemplary embodiment of the present invention. The verifying/reading method, which is performed after the data programming, is similar to the data reading method described above.

First, at a step S410, the latch terminals NLAT<1> and NLAT<2> of the first and second page buffers PB<1> and PB<2> are reset to a logic L state. The first and second bit line groups BL<1> and BL<2> and the sensing nodes NSEN<1> and NSEN<2> are precharged to a predetermined voltage.

At a step S420, data of memory cells connected to the first and second bit line groups BL<1> and BL<2> are latched and stored on the latch terminals NLAT<1> and NLAT<2> of the first and second page buffers PB<1> and PB<2>, respectively.

At a step S430, a read of the data of the first bit line group BL<1>, latched in the first page buffer PB<1>, is performed.

At a step S440, results of the operation of programming the memory cells connected to the first bit line group BL<1> are verified.

If the programming results have been verified as a success at the step S440, the data of the second bit line group BL<2>, latched in the second page buffer PB<2>, is dumped into the first page buffer PB<1> at a step S450.

Further, at a step S460, the data of the second bit line group BL<2>, dumped into the first page buffer PB<1>, is verified and read.

The electrical connection between the first page buffer PB<1> and the second page buffer PB<2> which uses the switch SW<1>, can be implemented using various methods.

Figure 11:
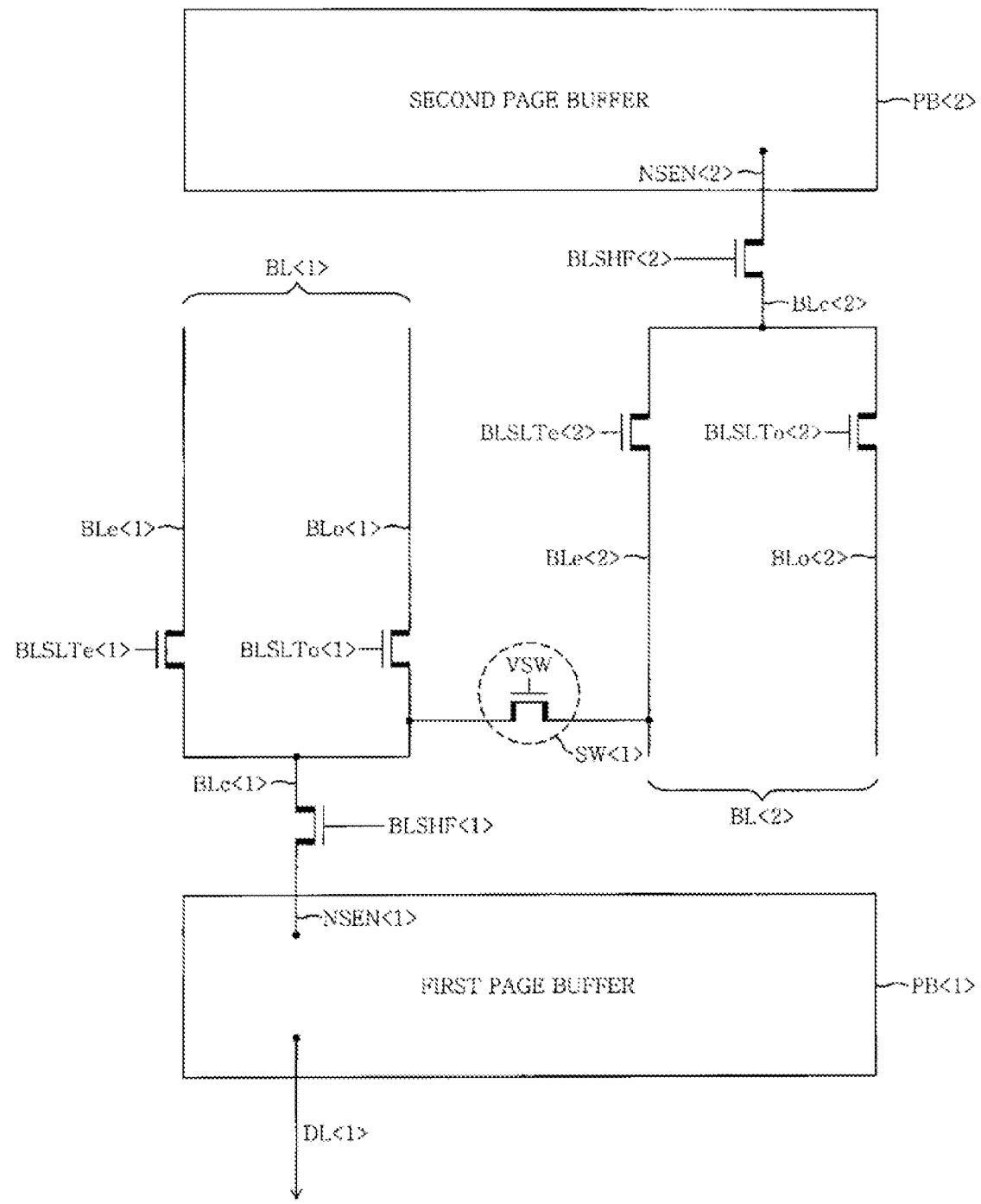
FIGS. 11 to 14 illustrate methods of electrically connecting the first and second page buffers to each other in FIG. 2., according to exemplary embodiments of the present invention.

As shown in FIG. 11, the location of the switch SW<1> can be modified to electrically connect the common bit line BLc<1> of the first bit line group BL<1> to the even bit line BLe<2> of the second bit line group BL<2>.

Figure 12:
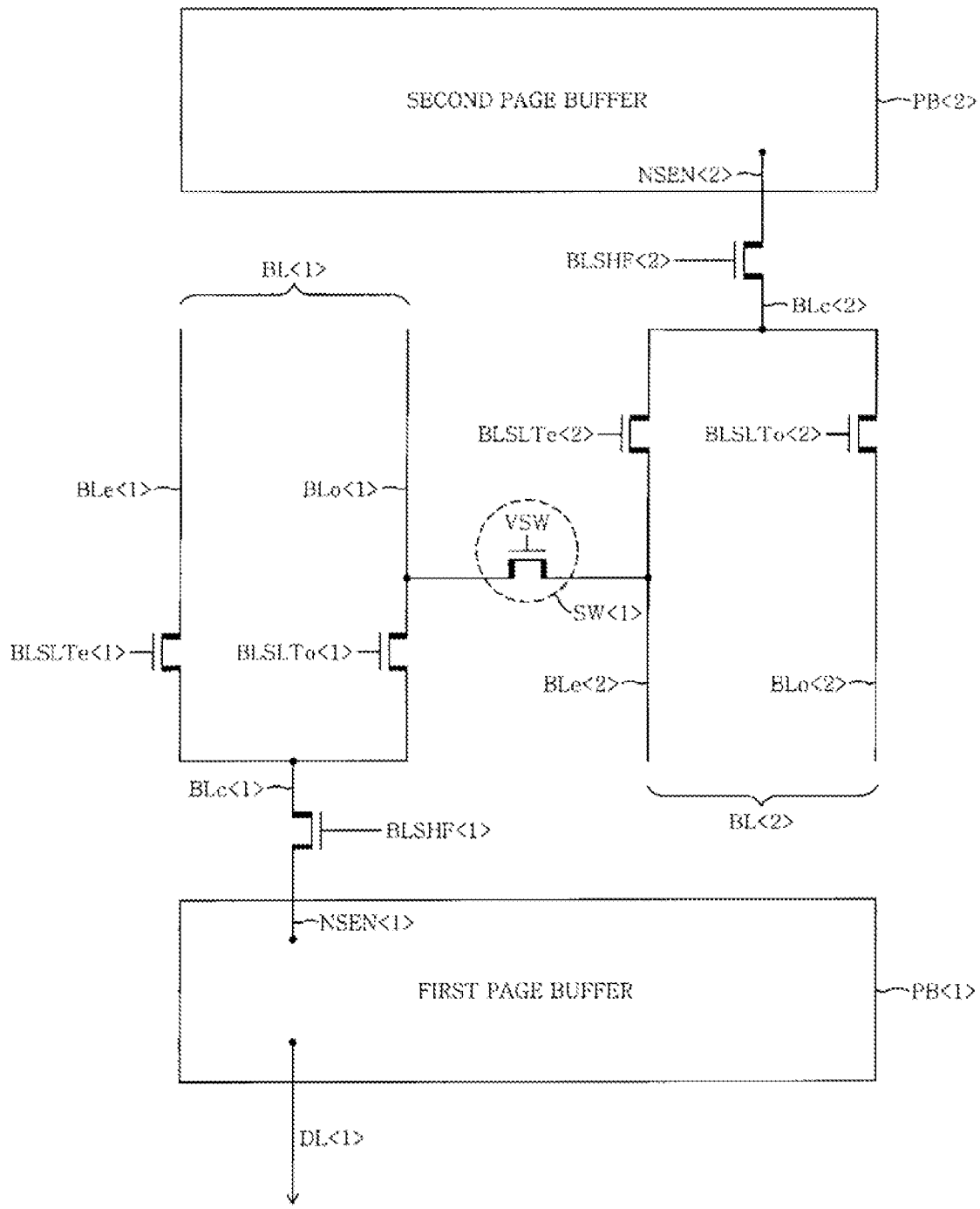

Further, as shown in FIG. 12, the location of the switch SW<1> can be modified to electrically connect the odd bit line BLo<1> of the first bit line group BL<1> to the even bit line BLe<2> of the second bit line group BL<2>.

Figure 13:
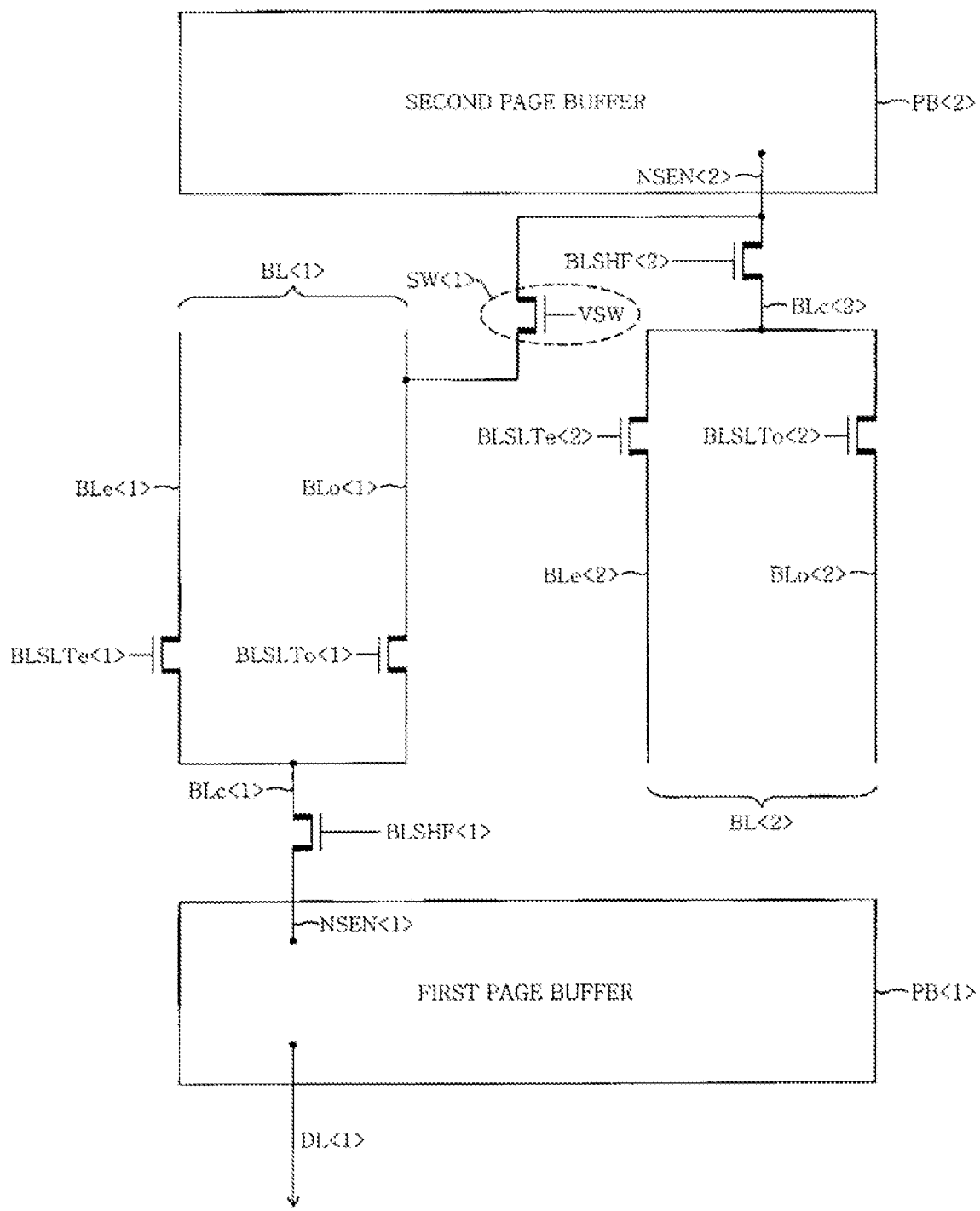
Figure 14:
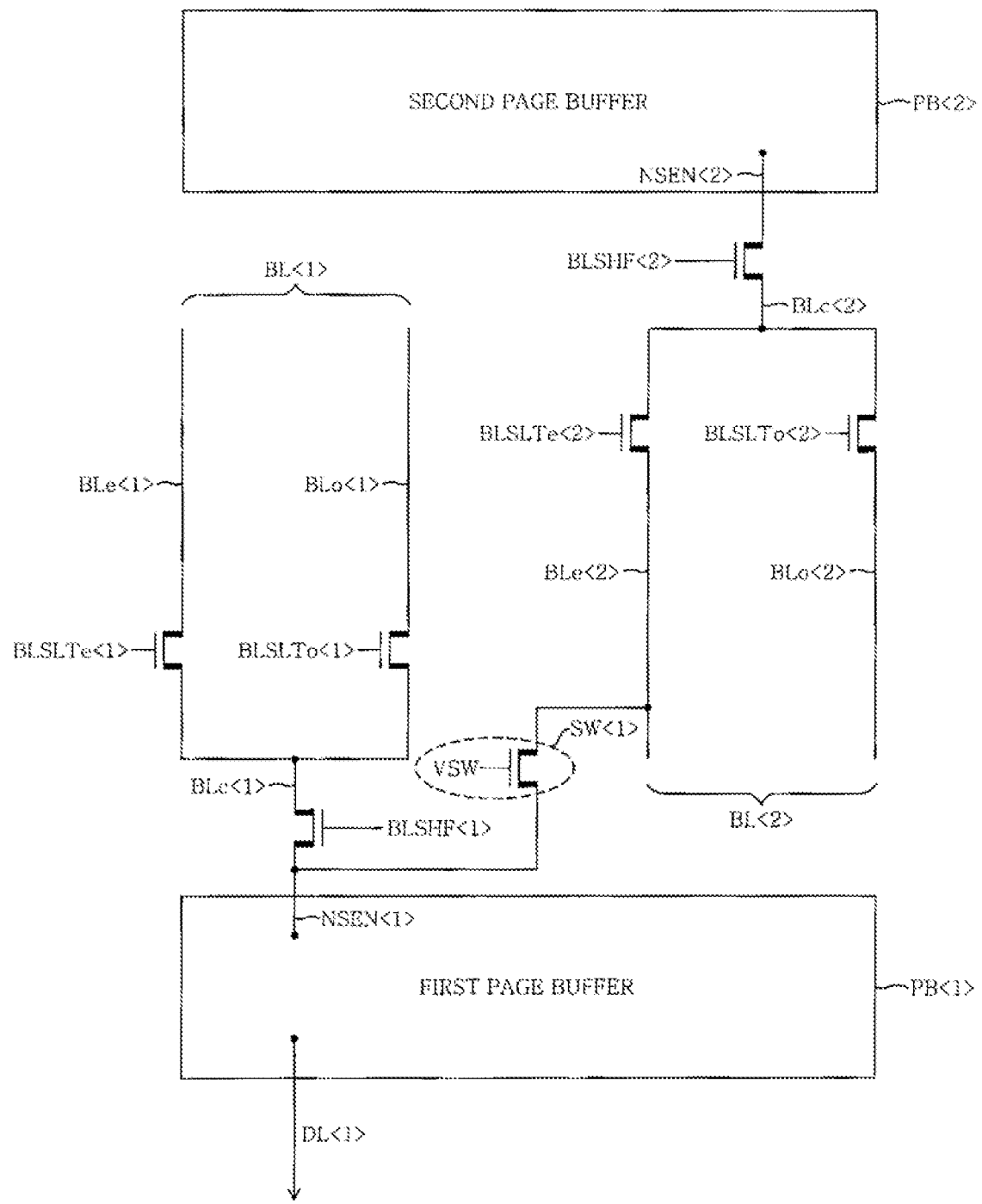

Further, as shown in FIG. 13, the location of the switch SW<1> can be modified to electrically connect the odd bit line BLo<1> of the first bit line group BL<1> to the sensing node NSEN<2> of the second page buffer PB<2>. Moreover, as shown in FIG. 14, the location of the switch SW<1> can be modified to electrically connect the sensing node NSEN<1> of the first page buffer PB<1> to the even bit line BLe<2> of the second page buffer PB<2>.

A method of driving a non-volatile semiconductor memory device according to exemplary embodiments of the present invention using the exemplary embodiments shown in FIGS. 11 to 14, can be easily understood by those skilled in the art by referring to technology related to the driving methods of FIGS. 3 to 10.

Although the exemplary embodiments of the present invention have been disclosed for illustrative purposes, those skilled in the art will appreciate that various 20 modifications, additions and substitutions are possible, without departing from the scope and spirit of the invention as disclosed in the accompanying claims.

What is claimed is:

1. A non-volatile semiconductor memory device, comprising:
    a memory array including a plurality of first bit line groups and a plurality of second bit line groups that are alternately arranged to be adjacent each other; a plurality of data lines;
    a plurality of first page buffers, wherein each of the first page buffers is electrically connected to a corresponding one of the first bit line groups and arranged on a first side of the memory array, the first page buffers transmitting data to the data lines;
    a plurality of second page buffers, wherein each of the second page buffers is electrically connected to a corresponding one of the second bit line groups and arranged on a second side of the memory; and
    a plurality of switches, wherein each of the switches enables data transmission between a corresponding one of the first page buffers and a corresponding one of the second page buffers through an electrical connection between corresponding first and second bit line groups.

2. The non-volatile semiconductor memory device according to claim 1, wherein each of the first and second bit line groups comprises: a common bit line electrically connected to a sensing node of a corresponding page buffer; and an even bit line and an odd bit line selectively connected to the common bit line.

3. The non-volatile semiconductor memory device according to claim 2, wherein at least one of the switches controls electrical connection between an odd bit line of a first bit line group of the plurality of first bit line groups and a common bit line of a second bit line group of the plurality of second bit line groups.

4. The non-volatile semiconductor memory device according to claim 2, wherein at least one of the switches controls electrical connection between a common bit line of a first bit line group of the plurality of first bit line groups and an even bit line of a second bit line group of the plurality of second bit line groups.

5. The non-volatile semiconductor memory device according to claim 2, wherein at least one of the switches controls electrical connection between an odd bit line of a first bit line group of the plurality of first bit line groups and an even bit line of a second bit line group of the plurality of second bit line groups.

6. The non-volatile semiconductor memory device according to claim 2, wherein at least one of the switches controls electrical connection between an odd bit line of a first bit line group of the plurality of first bit line groups and a sensing node of a second page buffer of the plurality of second page buffers.

7. The non-volatile semiconductor memory device according to claim 2, wherein at least one of the switches controls electrical connection between a sensing node of a first page buffer of the plurality of first page buffers and an even bit line of a second bit line group of the plurality of second bit line groups.

8. The non-volatile semiconductor memory device according to claim 1, wherein the switches are alternately arranged on the first and second sides of the memory array.

9. A method of driving a non-volatile semiconductor memory device, the non-volatile semiconductor memory device including a memory array having a first bit line group and a second bit line group that are arranged to be adjacent each other, the method comprising the steps of:
- latching data of a memory cell connected to the second bit line group into a second page buffer connected to the second bit line group and arranged on a second side of the memory array;
- electrically connecting the second bit line group to the first bit line group to facilitate data transfer there between;
- dumping the data latched into the second page buffer into a first page buffer connected to the first bit line group and arranged on a first side of the memory array; and
- reading the data that was dumped into the first page buffer.

10. A method of driving a non-volatile semiconductor memory device, the non-volatile semiconductor memory device including a memory array having a first bit line group and a second bit line group that are arranged to be adjacent each other, the method comprising the steps of:
- loading data to be programmed into a memory cell connected to the second bit line group into a first page buffer connected to the first bit line group and arranged on a first side of the memory array;
- electrically connecting the second bit line group to the first bit line group to facilitate data transfer there between;
- dumping the data loaded into the first page buffer into second page buffer corresponding to the second bit line group and arranged on a second side of the memory array; and
- programming the memory cell depending on the data dumped into the second page buffer.

* * * * *